United States Patent [19]

Motamedi

[11] Patent Number: 4,670,092

[45] Date of Patent: Jun. 2, 1987

[54] METHOD OF FABRICATING A CANTILEVER BEAM FOR A MONOLITHIC ACCELEROMETER

[75] Inventor: Manouchehr E. Motamedi, Thousand Oaks, Calif.

[73] Assignee: Rockwell International Corporation, El Segundo, Calif.

[21] Appl. No.: 853,319

[22] Filed: Apr. 18, 1986

[51] Int. Cl.$^4$ .................... H01L 21/306; B44C 1/22; C03C 15/00; C03C 25/06

[52] U.S. Cl. .................... 156/643; 29/580; 29/610 SG; 73/517 R; 73/720; 73/726; 156/647; 156/653; 156/657; 156/659.1; 156/662; 338/2; 338/47; 357/26; 357/55

[58] Field of Search ............... 156/643, 647, 649, 652, 156/653, 657, 659.1, 662; 252/79.1, 79.3, 79.4, 79.5; 29/580, 584, 586, 610 SG, 594, 595; 73/517 R, 720, 726; 338/2, 4, 42, 47; 357/26, 55

[56] References Cited

U.S. PATENT DOCUMENTS 4,071,838  1/1978  Block .......................... 156/647 X
4,597,003  6/1986  Aine et al. .................... 156/657 X

OTHER PUBLICATIONS

Roylance et al., "A Batch-Fabricated Silicon Accelerometer", IEEE Transactions on Electron Devices, vol. ED-26, No. 12, Dec. 1979, pp. 1911-1917.

Primary Examiner—William A. Powell
Attorney, Agent, or Firm—H. Fredrick Hamann; Craig O. Malin

[57] ABSTRACT

A monolithic accelerometer is fabricated with an integral cantilever beam sensing element which is etched out of a silicon wafer from the back surface. A thermal silicon oxide is formed on both surfaces of a (100) silicon wafer. Silicon oxide is removed from the back surface in a pattern which defines the sides of the cantilever beam and the sides of an alignment groove. The width and orientation of the openings in the silicon oxide are selected to control the depth of etching when the wafer is subsequently etched with an anisotropic etchant. An integrated circuit is then formed on the front surface and dry etching is used to complete the groove and separate the sides of the beam from the wafer.

7 Claims, 5 Drawing Figures

METHOD OF FABRICATING A CANTILEVER BEAM FOR A MONOLITHIC ACCELEROMETER

GOVERNMENT RIGHTS

The Government has rights in this invention pursuant to Contract No. DASG60-83-C-0101, awarded by the Department of the Army.

BACKGROUND OF THE INVENTION

This invention relates to the field of sensors and particularly to integrated circuit, monolithic accelerometers.

Photolithographic processes can be used to fabricate both sensors and interface circuits on a single silicon substrate. These monolithic devices can be made incredibly small and can provide much faster responses than the larger discrete sensor with separate electronic processing. Such monolithic sensors have been developed to measure light intensity, temperature, pressure, gas dynamics, and acceleration.

Monolithic sensors are particularly suitable for use in measuring acceleration. Such accelerometers can be made very small to reduce the load created in the accelerating vehicle and to provide fast response to any changes in acceleration. In addition, small monolithic accelerometers can be constructed to withstand the large forces (over 30,000 g) which are developed at extremely high accelerations.

Cantilever beams may be used as the stress generating member of monolithic accelerometers. Thin cantilever beams of silicon dioxide and p+ silicon have been isolated from a silicon substrate by removing the substrate from below a portion of a layered structure consisting of silicon dioxide and heavily doped p-type silicon (R. D. Jolly and R. S. Muller, J. of Elec. Chemical Soc., Vol. 127, No. 12, December, 1980). The etchant used to remove the substrate from the overlying beam structure was ethylenediamine, pyrocatechol, and water. This etchant, and other anisotropic etchants have also been proposed for processing silicon devices by Kenneth E. Beam in a paper entitled "Anisotropic Etching of Silicon" in the *IEEE Transactions on Electron Devices,* Vol. Ed-25, No. 10, October, 1978.

For very high accelerations, sturdier beams etched from the silicon substrate itself are needed. These sturdier beams can utilize the complete thickness of the silicon wafer rather than just a layered structure above the substrate such as described above. However, the etchant used and the process followed must be compatible with the processes required to construct the integrated circuit on the same chip as the beam. This has required the use of complicated etching processes which require many closely controlled protection and etching steps.

One method which has been used to control the depth of etching uses an epitaxially grown etch-stop layer of n-silicon during electroetching (U.S. Pat. No. 4,498,342). Another method uses a p-n junction formed in silicon to define the etching pattern of a diamine, water, and catechol etchant (U.S. Pat. No. 4,305,298). In some methods a silicon oxide layer is apparently used to stop etching with a sodium hydroxide etchant (U.S. Pat. No. 4,071,838).

SUMMARY OF THE INVENTION

It is an object of the invention to provide a monolithic accelerometer having a cantilever beam which is fabricated from the silicon substrate.

It is an object of the invention to provide a monolithic accelerometer having a cantilever beam which can be as thick as the silicon substrate from which it is formed.

It is an object of the invention to provide a process for fabricating a cantilever beam from a silicon substrate which is compatible with the photolithographic techniques used to fabricate an integrated circuit on the same silicon wafer as the cantilever beam.

According to the invention, silicon dioxide is formed on the front surface and back surface of a silicon wafer whose surfaces are in [100] planes of the silicon. Photolithography is used to form a pattern on the back surface. This pattern consists of openings in the silicon oxide which define the sides of a cantilever beam and also define alignment grooves. The openings which define the sides of the cantilever beam have a width less than that required to etch completely through the thickness of the silicon wafer during subsequent etching of the back surface of the wafer. The openings which define the alignment grooves have a width greater than that required to etch completely through the thickness of the silicon wafer during the subsequent etching. In both cases, the openings are oriented parallel to, or at a right angle to, the <110> direction of the silicon wafer.

The back surface of the silicon wafer which is exposed by the groove openings is then etched in an anisotropic etchant such as a mixture of ethylenediamine, pyrocatechol, and water. This is an anisotropic etchant which etches the silicon much faster from planes (100) which are normal to its crystallographic axes than from the other planes such as (111) planes.

Because of the anisotropic nature of the etchant and the orientation of the crystal axes of the silicon wafer, the silicon removed by the etchant in the openings in the patterned silicon dioxide forms sloping sides (parallel to the (111) planes) as the depth of the grooves increase. Because of the narrower width in the openings which define the sides of the cantilever beam, these sides meet at an apex before the entire thickness of the silicon wafer has been etched through. When the sloping sides meet, the etch rate is greatly reduced because there is no longer an exposed (100) plane, and therefore the wafer is not etched completely through its thickness.

However, the openings which define the alignment grooves do etch completely through the silicon wafer before the sloping sides meet because these grooves are wider than the cantilever grooves. Consequently, alignment grooves can be readily etched through the wafer (and to the silicon dioxide on the front face) without danger of also etching the cantilever beams through the wafer.

An integrated circuit can then be formed on the front face of the wafer using the alignment grooves to provide alignment between the cantilever grooves extending from the back face and the integrated circuit on the front face.

After the integrated circuit is formed, the cantilever beam is completely separated from the substrate by dry etching the front face of the wafer to remove the thin web of silicon joining the beam to the surrounding substrate.

These and other objects and features of the invention will be apparent from the following detailed description taken with reference to the accompanying drawings.

DESCRIPTION OF THE PREFERRED EMBODIMENT

Figure 1:
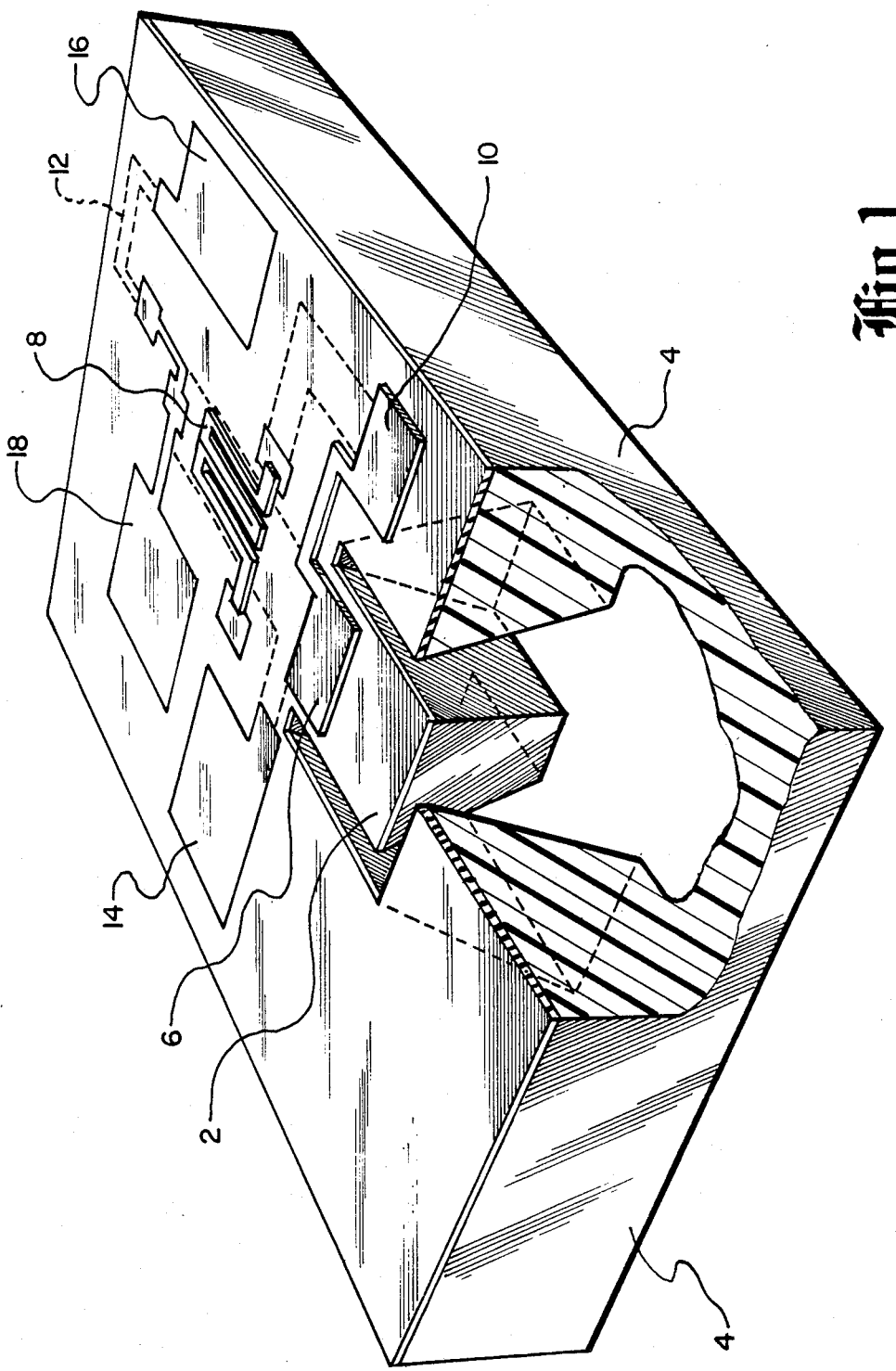
FIG. 1 is a perspective view of a monolithic accelerometer according to the invention.

FIG. 1 shows the front surface of a monolithic accelerometer which utilizes beam 2 that has been etched through the thickness of silicon wafer 4 from the back surface. The beam serves as a part of an accelerator sensor. Acceleration forces normal to the surface of the chip cause the beam to bend, and this induces strain in the beam.

Also shown in FIG. 1 is an integrated circuit used to measure the strain in the beam and provide an electrical output which indicates the acceleration which the chip is undergoing. This circuit utilizes a piezoelectric capacitor 6 to convert the strain in beam 2 to an electrical charge which is proportional to the acceleration. The charge is stored in the capacitor, so that the electrical potential at the output of the capacitor is proportional to acceleration. The electrical signal is buffered by an on-chip field effect transistor 8 which prevents the charge from leaking to ground. The on-chip integrated circuit also includes a temperature-compensating capacitor 10 to cancel pyroelectric effects, and a load resistor 12 to linearize field effect transistor 8. Voltage source contacts 14, 16 and output contact 18 are provided on the front surface of the chip. Other integrated circuits, for example a circuit using a surface acoustic wave (SAW) sensor can also be used to measure strain in beam 2. This invention is a method of constructing a beam which is compatible with the integrated circuit processes which are used to fabricate the detecting circuits on the same wafer from which the beam is formed.

Figure 2:
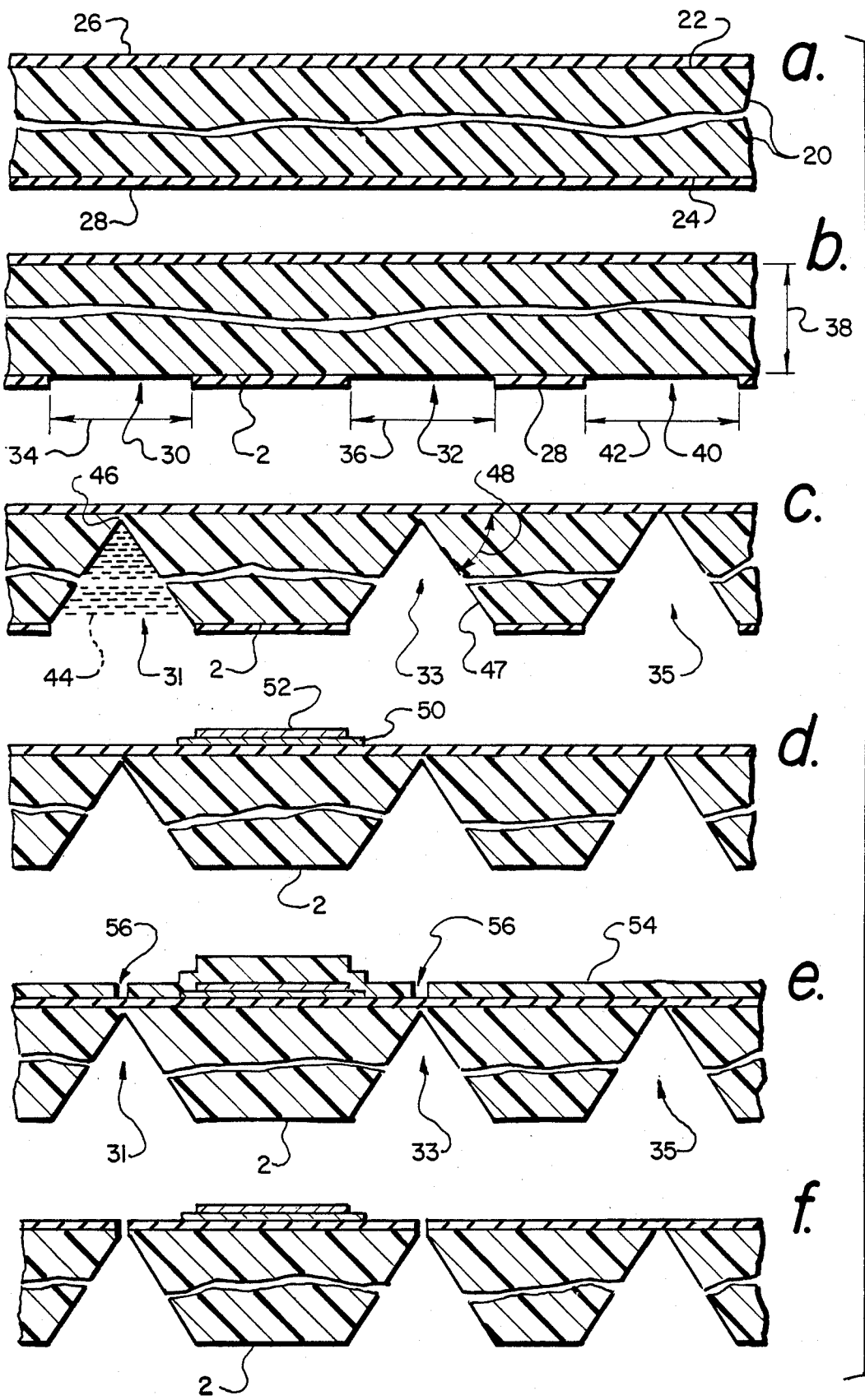
FIG. 2 is a cross-sectional view through the cantilever beam illustrating in views 2A-2F the steps used to fabricate the accelerometer.

FIG. 2 illustrates major steps utilized to fabricate a monolithic High-G beam accelerometer. Step 2A shows the cross-section of a (100) p-type silicon wafer 20 which has been polished on both its front surface 22 and back surface 24 with a 1.4 micron oxide grit. In this example, a 3-inch wafer which is 23 mil thick is used, although the invention is applicable to other size wafers. The "flat" (the straight section of an otherwise circular edge) of the wafer is parallel to the <110> direction of the silicon, and all masks are aligned so that the edges of beam 2 will be parallel or orthogonal to the flat.

The front and back surfaces are provided with a thermal oxide 26, 28 by heating the wafer in a known manner. After thermal oxidation, oxide 28 on the back surface of the wafer is patterned using known photolithographic techniques to define the sides of beam 2 and etch away exposed portions of oxide 28 using buffered hydrofluoric acid. As shown in step 2B, openings 30 and 32 in oxide 28 define the edges of beam 2 on the back surface of the wafer. Their widths 34, 36 must be narrow enough so that the grooves which form the beams do not grow completely through the wafer during subsequent etching. This width can be determined empirically for particular etching conditions. Because of the properties of anisotropic etchants, the depth of the grooves can be closely controlled, as explained with reference to Step 2C below. Conversely, opening 40 which defines an alignment groove 35 has a width 42 which is greater than openings 30 and 32 which define beam 2. During etching out of beam 2, alignment groove 35 is etched completely through the wafer so that it can be used to align the mask pattern on the front surface of the wafer.

Step 2C shows the wafer after the back surface has been etched to create beam grooves 31, 33 and alignment groove 35. The etchant used is a mixture of ethylenediamine, pyrocatechol, and water (EDP). This is an anisotropic etchant which etches (100) planes (represented by dashed lines 44 in groove 31) much faster than the diagonal or side planes. Consequently, etching proceeds rapidly across the wafer until the sides of the grooves meet at apex 46. The (100) planes are closed out at apex 46 and the etching substantially stops.

The sides 47 of grooves 30, 32, and 40 are in (111) planes, and they form an angle 48 of about 54.7° with the front surface, plane (100). For specific etching conditions, the location of apex 46 is determined by the width of openings 30, 32, 40 (the amount of the silicon wafer exposed to the etchant). If a narrow opening of silicon is exposed, the apex will occur near he back surface. However, if a wide opening of silicon is exposed, the apex will be projected outside the wafer above the front surface as shown or groove 35. Because the etching rate is much slower after an apex is formed, the depth of the goove can be closely controlled to stop short of front surface 22 as shown for grooves 31, 33 in step 2C. At the same time, an alignmnt groove 35 which just penetrates front surface 22 can be formed by providing an opening 40 in the oxide mask which is wider for the alignment groove than for the beam forming grooves.

Figure 3:
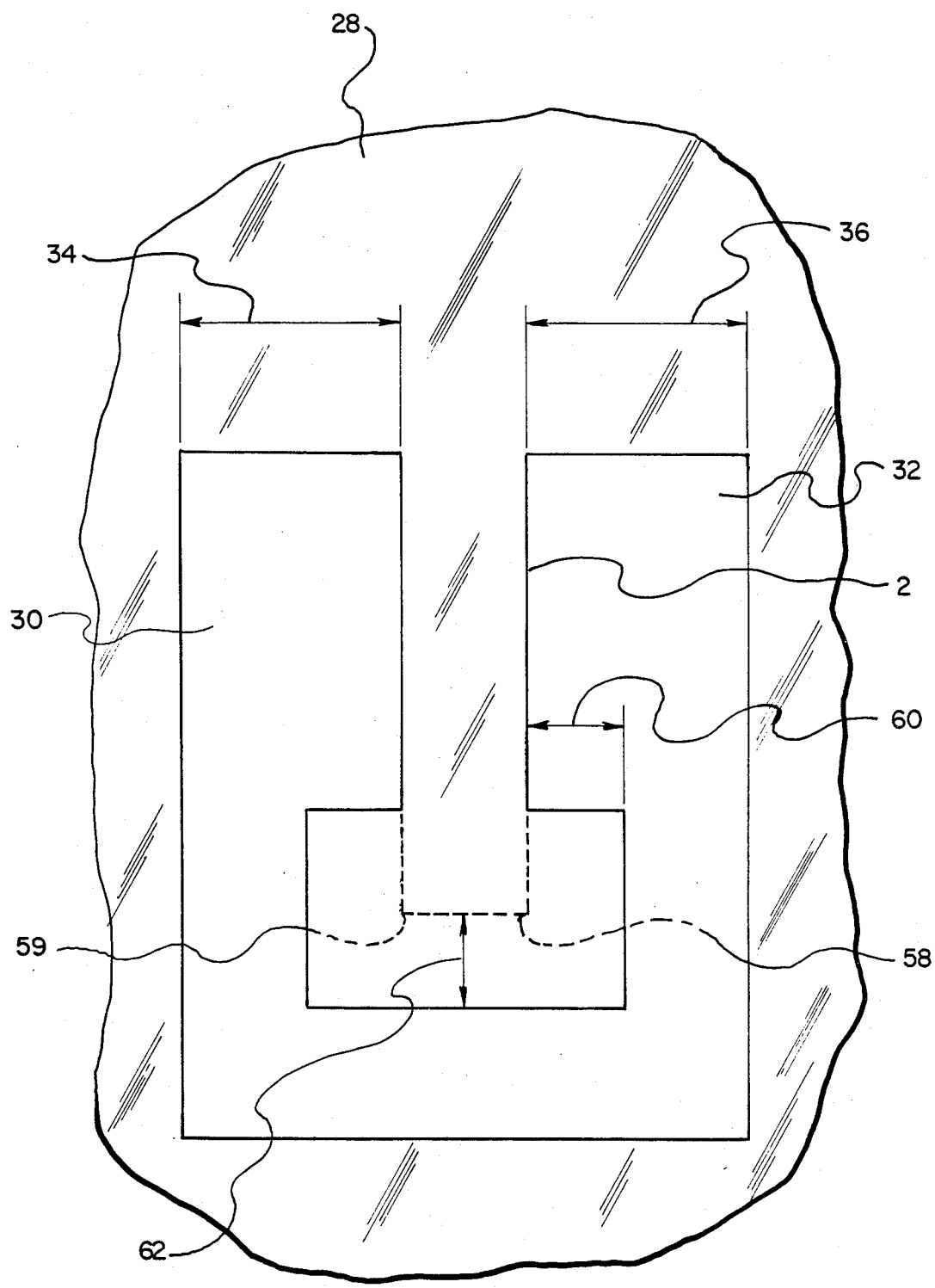
FIG. 3 is a view of the back surface of a wafer showing a pattern which provides a cantilever beam with corner protection.

FIG. 3 shows the pattern formed on the back of the wafer after openings 30 and 32 have been etched through silicon oxide 28. Beam 2 has two outside corners 58, 59 which are shown by the dashed lines extending on oxide 28. An area of silicon oxide has been left around corners 58, 59 for widths 60 and 62. This extra silicon oxide has been provided to protect the external corners from undercutting during anisotropic etching (step 2C of FIG. 2). The anisotropic etchant etches (212), (122), (212) and (122) planes (in addition to the (100) plane as described above). These planes are exposed at outside corners 58, 59 under the silicon oxide. Consequently, additional protective oxide is provided around corners 58, 59 of beam 2. If protective silicon oxide is not provided, beam 2 will have a shortened, undercut end. In some applications, such as undercut beam end may be completely acceptable. However, undercutting can be greatly reduced by providing corner protection. The width of protection provided can be determined experimentally depending upon the amount of protection desired. It need not be any greater than one-half the widh of the opening in order to provide maximum corner protection.

Satisfactory etching has been accomplished using a mixture of 144 gms of pyrocatechol dissolved in 384 cc of deionized water and 816 cc of ethylene diamine. The wafer was etched in a reflux system for 1 hour and 15 minutes at 114° C. Under these conditions, the etch rate is approximately 25 microns per hour. During etching, the front surface of the wafer is protected by oxide 26 and the back surface, except for the openings, is protected by oxide 28. Under these etch conditions, a width 34, 36 for openings 30, 32 which is less than twice the thickness of the wafer was satisfactory for forming beam grooves 31, 33. For alignment groove 35, a width 42 which is over twice the thickness of the wafer is used to etch through the wafer.

After forming the sides of beam 2, conventional integrated circuit techniques can be used to fabricate an integrated circuit on the front face. Step 2D shows a ZnO capacitor 50 and aluminum metal 52 deposited on beam 2 as part of the integrated circuit such as shown in FIG. 1.

In Step 2E, photoresist 54 has been deposited over the integrated circuit. Openings 56 are aligned (using groove 35) with grooves 31, 33 which form the sides of beam 2. As shown in step F, dry etching is then used to separate the sides of beam 2 from the front surface of the wafer, and photoresist 54 is removed.

The above described processes provide a means of fabricating a cantilever beam in a silicon wafer from the back surface, and then providing suitable integrated circuit on the front surface using standard photolithographic techniques. Known procedures for pretesting the IC, dicing the wafer, and packaging the chip are then used to provide the monolithic accelerometer.

Figure 5:
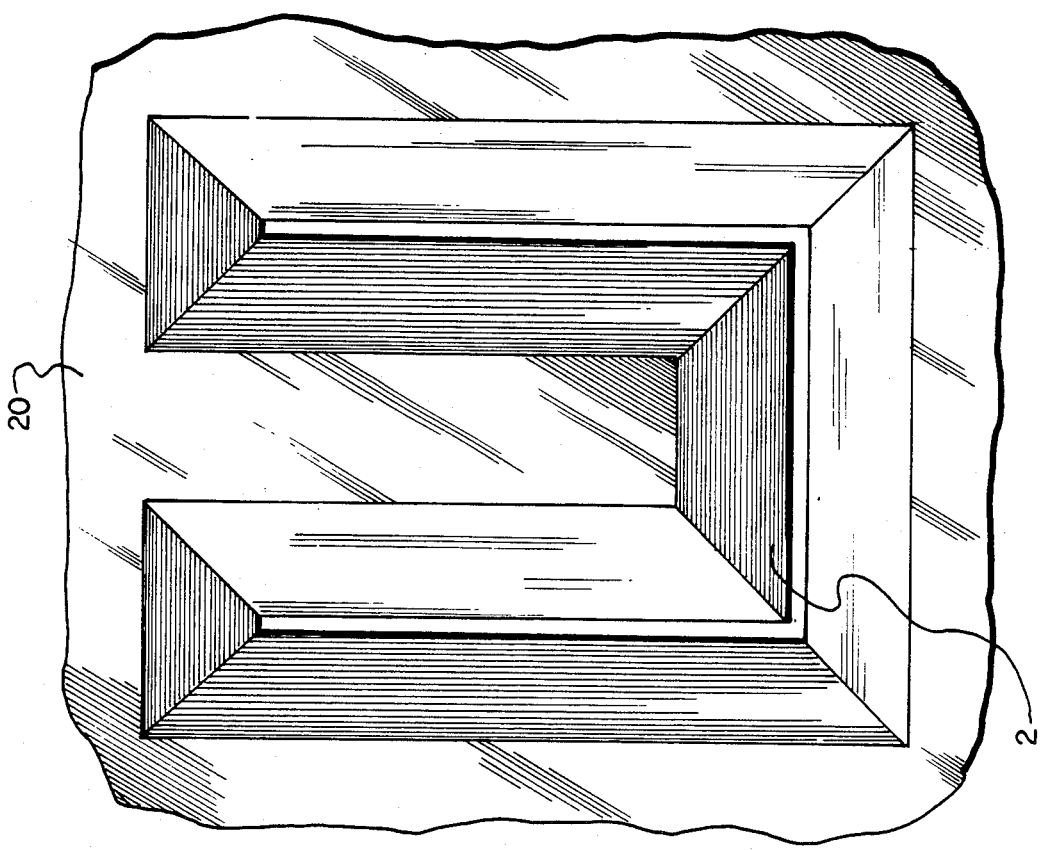
FIG. 5 is a view of the back surface of a cantilever beam.
Figure 4:
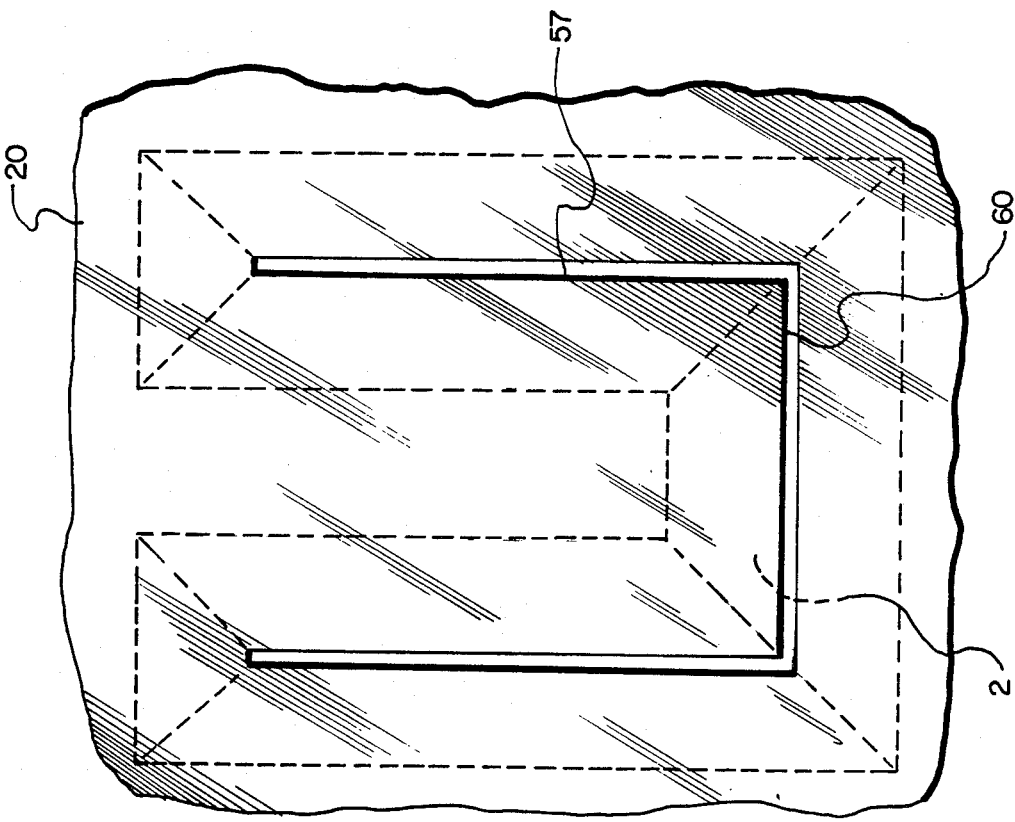
FIG. 4 is a view of the front surface of a cantilever beam.

FIG. 4 shows a front view of cantilever beam 2 in wafer 20. Side 57 is parallel to the <110> direction (or the <110> direction at 90° to it) and side 60 is parallel to the <110> direction (or the <110> directions). FIG. 5 shows a back view of cantilever beam 2. The sloping sides shown in FIG. 4 are created by the anisotropic etchant working from the back surface as shown in the cross sections of FIG. 2.

Numerous variations can be made without departing from the invention. For example, anisotropic etchants other than the exemplary ethylenediamine etchant (such as an etchant of KOH, normal proponal, and $H_2O$) can be used provided that the etchant etches the (100) plane faster than the (111) plane. Also dry etching technique similar to frontside etching can be used instead of EDP chemical etching for the backside etching. Since it is possible to control etched sidewalls of dry etching by the RF power level, then any type of the etching profile from isotropic to anisotropic can be achieved. In the case the application requires anisotropic dry etching for the backside, a corner protection masking should be used. Accordingly, it should be understood that the form of the invention described above is illustrative and is not intended to limit the sope of the invention.

What is claimed is:

1. A method of fabricating a cantilever beam for a monolithic accelerometer comprising the steps of:

providing a silicon wafer having a front surface and a back surface in (100) planes;

providing a silicon oxide on said surfaces;

forming cantilever beam openings in said silicon dioxide on said back surface to define the sides of said cantilever beam, said openings being oriented parallel to the <110> or <110> directions of said silicon wafer and having a width less than that required to etch completely through said silicon wafer during the subsequent step of etching the back surface of said silicon wafer;

forming alignment openings in said silicon dioxide on said back surface to define alignment grooves, said alignment openings being oriented parallel to the <110> or <110> directions of said silicon wafer and having a width greater than that required to etch completely through said silicon wafer during the subsequent step of etching the back surface of said silicon wafer;

etching the back surface of said silicon wafer which is exposed by said beam and alignment openings in said silicon dioxide in an anisotropic etchant to form cantilever beam grooves and alignment grooves in said silicon wafer;

discontinuing said etching after the sides of said cantilever beam grooves have intersected each other and after said alignment grooves have extended to said front surface of said wafer;

aligning said cantilever beam grooves on said back surface with an integrated circuit pattern on said front surface by means of said alignment grooves;

fabricating an integrated circuit for said monolithic accelerometer on said front surface of said silicon wafer; and etching said front surface through to said cantilever beam grooves to separate the sides of said cantilever beam from said wafer.

2. The method as claimed in claim 1, wherein said anisotropic etchant comprises a mixture of ethylenediamine, pyrocathechol, and water.

3. The method as claimed in claim 2 wherein said width of said cantilever beam openings is less than about two times the thickness of said silicon wafer, and wherein said width of said alignment openings is greater than about two times the thickness of said silicon wafer.

4. The method as claimed in claim 1 wherein said step of etching said front surface comprises dry etching said front surface.

5. The method as claimed in claim 1 wherein said cantilever beam openings are reduced in width in the locations adjacent outside corners of said cantilever beam to provide corner-protecting silicon dioxide and thereby compensate for undercutting of said corners during said step of etching said backside.

6. The method as claimed in claim 5 wherein the width of said beam openings is reduced by less than one-half in said locations adjacent outside corners.

7. The method as claimed in claim 1 wherein said anisotropic etchant comprises dry etching at an RF power level which provides anisotropic etching.

* * * * *